United States Patent
Ikezaki

(10) Patent No.: US 7,199,583 B2
(45) Date of Patent: Apr. 3, 2007

(54) MR IMAGE PRODUCTION METHOD AND MRI APPARATUS

(75) Inventor: Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 69 days.

(21) Appl. No.: 11/216,444

(22) Filed: Aug. 31, 2005

(65) Prior Publication Data

US 2006/0058634 A1    Mar. 16, 2006

(30) Foreign Application Priority Data

Sep. 10, 2004    (JP)    ............... 2004-263290

(51) Int. Cl.
*G01V 3/00*    (2006.01)

(52) U.S. Cl. ..................................... 324/309

(58) Field of Classification Search ............. None
See application file for complete search history.

(56) References Cited

U.S. PATENT DOCUMENTS

| | | | |
|---|---|---|---|
| 5,732,701 A | | 3/1998 | Yoshitome et al. |
| 6,373,249 B1 * | | 4/2002 | Kwok et al. ........... 324/306 |
| 6,380,741 B1 * | | 4/2002 | Hajnal et al. ........... 324/318 |
| 6,489,764 B2 | | 12/2002 | Yamazaki et al. |
| 6,512,372 B1 | | 1/2003 | Ikezaki |
| 6,703,834 B2 | | 3/2004 | Ikezaki |
| 6,836,114 B2 * | | 12/2004 | Reddy et al. ........... 324/307 |
| 6,842,001 B2 | | 1/2005 | Ikezaki |
| 7,084,626 B2 * | | 8/2006 | Ma et al. ........... 324/307 |
| 7,151,370 B1 * | | 12/2006 | Hargreaves ........... 324/307 |
| 2001/0021795 A1 | | 9/2001 | Yamazaki et al. |
| 2002/0167319 A1 | | 11/2002 | Ikezaki |

(Continued)

FOREIGN PATENT DOCUMENTS

JP    3353826    9/2002

(Continued)

OTHER PUBLICATIONS

Pruessmann et al.: "Sense: Sensitivity Encoding for Fast MRI," Magnetic Resonance in Medicine 42:952-962 (1999), pp. 952-962.

(Continued)

*Primary Examiner*—Brij Shrivastav
*Assistant Examiner*—Dixomara Vargas
(74) *Attorney, Agent, or Firm*—Carl B. Horton, Esq.; Armstrong Teasdale LLP

(57) ABSTRACT

A method to generate separate water and fat images includes applying a pulse sequence, which brings about no phase difference between a water signal and a fat signal, so as to acquire calibration data items that provide the distribution of sensitivities of coils, applying a pulse sequence, which uses the phase difference between a water signal and a fat signal to separate the signals from each other, so as to receive NMR signals, which are induced by a subject, in parallel with one another using I ($\geq 2$) coils, and acquiring real data items detected by the respective coils, producing a synthetic image by performing arithmetic operations on the calibration data items and the real data items detected by the respective coils so as to remove aliasing oriented in a phase encoding direction, and producing at least one of a water image and a fat image from the synthetic image.

16 Claims, 4 Drawing Sheets

U.S. PATENT DOCUMENTS

| | | | |
|---|---|---|---|
| 2003/0083571 | A1 | 5/2003 | Ikezaki |
| 2003/0228043 | A1 | 12/2003 | Ikezaki |
| 2004/0039276 | A1 | 2/2004 | Ikezaki |
| 2004/0189299 | A1 | 9/2004 | Ikezaki |
| 2006/0241381 | A1* | 10/2006 | Wang et al. ............. 600/410 |

FOREIGN PATENT DOCUMENTS

| | | |
|---|---|---|
| JP | 2003-052667 | 2/2003 |
| JP | 2003-079595 | 3/2003 |

OTHER PUBLICATIONS

Shreyas S. Vasanawala et al.; Linear Combination Steady-State Free Precession MRI; Magnetic Resonance in Medicine 43:82-90 (2000) pp. 82-90.

International Search Report;Place of Search—The Hague; Date May 23, 2006; Reference 166050/10909, Application No./ Patent No. 05255367.4-2209; 7 pgs.

C.A. McKenzie et al.; "Abdominal Three Point Dixon Imaging with Self Calibrating Parallel MRI"; Proc. Intl. Soc. Mag. Reson. Med. 11 (2004); 2 pgs.

J. Ma et al.; "Multipoint Dixon Imaging Using Sensitivity Encoding"; Proc. Intl. Soc. Mag. Reson. Med. 11 (2003); 2 pgs.

J. Ma et al.; Phased Array Coil Compatible T2-weighted Fast Spin Echo Dixon Imaging; Proc. Intl. Soc. Mag. Reson. Med. 10 (2002); 1 pg.

Scott B. Reeder et al.; Multicoil Dixon Chemical Species Separation with an Iterative Least-Squares Estimation Method; Magnetic Resonance in Medicine 51:35-45 (2004).

S.B. Reeder et al.; Multi-Coil "Dixon" Fat-Water Separation with SSFP Imaging; Proc. Intl. Soc. Mag. Reson. Med. 11 (2003) 2 pgs.

* cited by examiner

HS1

MR IMAGE PRODUCTION METHOD AND MRI APPARATUS

CROSS REFERENCE TO RELATED APPLICATIONS

This application claims the benefit of Japanese Application No. 2004-263290 filed Sep. 10, 2004.

BACKGROUND OF THE INVENTION

The present invention relates to a magnetic resonance (MR) image production method and a magnetic resonance imaging (MRI) system. More particularly, the present invention relates to an MR image production method and an MRI system capable of accurately producing separate water and fat images using a plurality of coils despite a small number of arithmetic operations and a short processing time.

In the past, a technique of producing separate water and fat images such as a linear combination (LC) steady-state free precession (SSFP) technique, a Dixon technique, or a three-point Dixon technique, that is, a technology for producing a water image or a fat image by utilizing a phase difference between a water signal and a fat signal has been known (refer to, for example, Patent Document 1, Patent Document 2, and Non-patent Document 1).

On the other hand, a parallel imaging technology falling into an image synthesis method such as a sum-of-square method and a sensitivity encoding (SENSE) method, that is, a technology for receiving nuclear magnetic resonance (NMR) signals, which are induced by a subject, in parallel with one another using a plurality of coils, and processing them to produce one MR image has been known (refer to, for example, Patent Document 3 and Non-patent Document 2).

[Patent Document 1] Japanese Patent No. 3353826

[Patent Document 2] Japanese Unexamined Patent Application Publication No. 2003-52667

[Patent Document 3] Japanese Unexamined Patent Application Publication No. 2003-79595

[Non-Patent Document 1] "Linear Combination Steady State Free Precession MRI" (Vasanawala et al., Magnetic Resonance in Medicine, Vol. 43, 2000, pp. 82–90)

[Non-Patent Document 2] "SENSE: Sensitivity Encoding for Fast MRI" (Klaas P. Pruessmann et al., Magnetic Resonance in Medicine, Vol. 42, 1999, pp. 952–962)

A conventional method of producing separate water and fat images using a plurality of coils comprises, for example, steps (1) to (4) described below.

(1) A pulse sequence that causes a fat signal to have a phase difference of −90° from a water signal is applied in order to receive NMR signals, which are induced by a subject, in parallel with one another using I ($I \geq 2$) coils, whereby complex images $H_{-R}(1)$ to $D_{-R}(I)$ are produced in association with the coils.

(2) A pulse sequence that causes a fat signal to have a phase difference of +90° from a water signal is applied in order to receive NMR signals, which are induced by a subject, in parallel with one another using the I coils, whereby complex images $H_{+R}(1)$ to $H_{+R}(I)$ are produced in association with the coils.

(3) Water images $w(i)=H_{-R}(i)+H_{+R}(i)$ are produced in association with the coils, and fat images $f(i)=H_{-R}(i)-H_{+R}(i)$ are produced in association therewith (where i denotes, 1, 2, etc., or I).

(4) The sum-of-square method based on the parallel imaging technology is adopted in order to synthesize the water images $w(i)$ associated with the coils, whereby one water image W is produced. Likewise, the fat images $f(i)$ associated with the coils are synthesized in order to produce one fat image F.

However, according to the above method, at step (3), arithmetic operations must be repeated by the same number of times as the number of coils. This poses a problem in that the total number of arithmetic operations increases and a processing time extends.

Moreover, any other conventional method for producing separate water and fat images using a plurality of coils, and any other conventional parallel imaging technology may be used in combination. However, the conventional parallel imaging technology employs a gradient echo production pulse sequence for the purpose of shortening a scan time. The gradient echo production pulse sequence brings about a phase difference between a water signal and a fat signal from which calibration data is detected. Therefore, a phase difference between a water signal and a fat signal from which real data is detected is lost during synthesis. This poses a problem in that separate water and fat images cannot be produced accurately.

SUMMARY OF THE INVENTION

Therefore, an object of the present invention is to provide an MR image production method and an MRI apparatus capable of accurately producing separate water and fat images using a plurality of coils despite a small number of arithmetic operations and a short processing time.

According to the first aspect of the present invention, there is provided an MR image production method comprising: a calibration scan step of applying a pulse sequence that brings about no phase difference between a water signal and a fat signal so as to acquire calibration data items that provide the distribution of the sensitivities of the coils; a real scan step of applying a pulse sequence that uses a phase difference between a water signal and a fat signal to separate the signals from each other so as to receive NMR signals, which are induced by a subject, in parallel with one another using I ($\geq 2$) coils, and acquiring real data items detected by the respective coils; a synthesis step of producing a synthetic image by performing arithmetic operations on the calibration data items and the real data items detected by the respective coils so as to remove aliasing oriented in a phase encoding direction; and a water image-fat image separation step of producing at least one of a water image and a fat image from the synthetic image.

In the MR image production method according to the first aspect, the water image-fat image separation that requires a large number of arithmetic operations and a long processing time is not performed relative to each coil but performed on a synthetic image. This results in a decreased number of arithmetic operations and a shortened processing time.

According to the second aspect of the present invention, at the calibration scan step included in the MR image production method in accordance with the first aspect, a spin echo production pulse sequence is employed.

In the MR image production method according to the second aspect, since the spin echo production pulse sequence is employed, a water signal and a fat signal from which provide calibration data is detected do not have a phase difference. The phase difference between a water signal and a fat signal from which real data is detected is held intact during the synthesis (will not be disturbed by the calibration data). Consequently, after the synthesis is completed, the water image-fat image separation can be performed accurately.

According to the conventional parallel imaging technology, a gradient echo production pulse sequence is employed in order to shorten a scan time. However, the gradient echo production pulse sequence brings about a phase difference between a water signal and a fat signal from which calibration data is detected. Therefore, the phase difference between a water signal and a fat signal from which real data is detected is lost during synthesis (disturbed by the calibration data). Consequently, after the synthesis is completed, the water image-fat image separation cannot be performed.

According to the third aspect of the present invention, the spin echo production pulse sequence employed in the MR image production method in accordance with the second aspect is a pulse sequence of a 90° pulse and a 180° pulse for producing a train of spin echoes (SE), a pulse sequence of a 90° pulse and repeated 180° pulses for producing a train of fast spin echoes (FSE), or a pulse sequence for producing a three-dimensional train of fast spin echoes, which are used for phase encoding, even in a slicing direction.

In the MR image production method according to the third aspect, the pulse sequence for producing the train of spin echoes, the train of fast spin echoes, or the three-dimensional train of fast spin echoes can be adopted as the spin echo production pulse sequence.

According to the fourth aspect of the present invention, at the calibration scan step included in the MR image production method in accordance with any of the first to third aspects, the I coils and a body coil are used to acquire calibration data.

In the MR image production method according to the fourth aspect, at the synthesis step, complex images $C(i)$ are produced from calibration data items $c(i)$ detected by the respective I coils, and a complex image $C(0)$ is produced from calibration data $c(0)$ detected by the body coil. Each of the complex images $C(i)$ associated with the coils is divided by the complex image $C(0)$ associated with by the body coil, whereby sensitivity maps $s(i)$ of the respective coils are created. A synthetic image V is produced based on a sensitivity matrix S having the sensitivity maps $s(i)$ of the coils arranged orderly and an image matrix A having complex images $H(i)$, which are produced from real data items $h(i)$ detected by the respective coils, arranged orderly.

$$V=(S^H \Psi^{-1} S)^{-1} S^H \Psi^{-1} A$$

where $S^H$ denotes a conjugate transpose of a matrix S, and $\Psi$ denotes a noise correlation matrix. If the noise correlation matrix is unused, $\Psi$ denotes a unit matrix. The calculation is performed pixel by pixel.

The above formula is described in Non-patent Document 2 ("SENSE: sensitivity encoding for fast MRI" (Klaas P. Pruessmann et al., Magnetic Resonance in Medicine, Vol. 42, 1999, pp. 952–962)).

According to the fifth aspect of the present invention, at the calibration scan step included in the MR image production method in accordance with any of the first to third aspects, the I coils alone are used to acquire calibration data.

In the MR image production method according to the fifth aspect, at the synthesis step, complex images $C(i)$ are produced from calibration data items $c(i)$ detected by the I coils, and the sum-of-square method is applied to the complex images $C(i)$ in order to produce sensitivity maps $s(i)$ of the respective coils. A synthetic image V is produced based on a sensitivity matrix S having the sensitivity maps $s(i)$ of the coils arranged orderly and an image matrix A having complex images $H(i)$, which are produced from read data items $h(i)$ detected by the coils, arranged orderly.

$$V=(S^H \Psi^{-1} S)^{-1} S^H \Psi^{-1} A$$

The formula is described in Non-patent Document 2 ("SENSE: sensitivity encoding for fast MRI" (Klaas P. Pruessmann et al., Magnetic Resonance in Medicine, Vol. 42, 1999, pp. 952–962)).

According to the sixth aspect of the present invention, at the real scan step included in the MR image production method in accordance with any of the first to fifth aspects, a pulse sequence that brings about a phase difference of $2\pi/n$ ($n \geq 2$) between a water signal and a fat signal is applied in order to acquire real data items detected by the respective coils. At the synthesis step, complex images $C(i)$ are produced from the calibration data items detected by the respective coils, complex images $H(i)$ are produced from the real data items detected by the respective coils, and a synthetic image V is produced from the complex images $C(i)$ and complex images $H(i)$. At the water image-fat image separation step, at least one of a water image W and a fat image F is produced from the synthetic image V.

In the MR image production method according to the sixth aspect, the technology described in the known Patent Document 1 (Japanese Patent No. 3353826) is applied to the present invention.

According to the seventh aspect of the present invention, at the real scan step included in the MR image production method in accordance with any of the first to fifth aspects, a pulse sequence defined in the Dixon technique is applied in order to acquire real data items detected by the respective coils. At the synthesis step, complex images $C(i)$ are produced from calibration data items detected by the respective coils, and complex images $H1(i)$ and $H2(i)$ are produced from real data items detected by the respective coils. A synthetic image V1 is produced from the complex images $C(i)$ and complex images $H1(i)$, and a synthetic image V2 is produced from the complex images $C(i)$ and complex images $H2(i)$. At the water image-fat image separation step, at least one of a water image W and a fat image F is produced from the synthetic images V1 and V2.

In the MR image production method according to the seventh aspect, the known Dixon technique is applied to the present invention.

According to the eighth aspect of the present invention, at the real scan step included in the MR image production method in accordance with any of the first to fifth aspects, a pulse sequence defined in the three-point Dixon technique is applied in order to acquire real data items detected by the respective coils. At the synthesis step, complex images $C(i)$ are produced from calibration data items detected by the respective coils, and complex images $H1(i)$, $H2(i)$, and $H3(i)$ are produced from real data items detected by the respective coils. A synthetic image V1 is produced from the complex images $C(i)$ and complex images $H1(i)$, a synthetic image V2 is produced from the complex images $C(i)$ and complex images $H2(i)$, and a synthetic image V3 is produced from the complex images $C(i)$ and complex images $H3(i)$. At the water image-fat image separation step, at least one of a water image W and a fat image F is produced from the synthetic images V1, V2, and V3.

In the MR image production method according to the eighth aspect, the known three-point Dixon technique is applied to the present invention.

According to the ninth aspect of the present invention, there is provided an MRI apparatus comprising: a body coil; $I (\geq 2)$ coils; a calibration scan means for by applying a pulse sequence, which brings about no phase difference between a water signal and a fat signal so as to acquire calibration data items that provide the distribution of the sensitivities of coils; a real scan means for applying a pulse sequence, which uses the phase difference between a water signal and a fat signal to separate the signals from each other, so as to receive NMR signals, which are induced by a subject, in parallel with one another using the I ($\geq 2$) coils, and acquiring real data items detected by the respective coils; a synthesis means for producing a synthetic image by performing arithmetic operations on the calibration data items and the real data items detected by the respective coils so as to remove aliasing oriented in a phase encoding direction; and a water image-fat image separation means for producing at least one of a water image and a fat image from the synthetic image.

In the MRI apparatus according to the ninth aspect, the MR image production method in accordance with the first aspect is preferably implemented.

According to the tenth aspect of the present invention, the calibration scan means included in the MRI apparatus in accordance with the ninth aspect employs a spin echo production pulse sequence.

In the MRI apparatus according to the tenth aspect, the MR image production method in accordance with the second aspect is preferably implemented.

According to the eleventh aspect of the present invention, the spin echo production pulse sequence employed in the MRI apparatus in accordance with the tenth aspect is a pulse sequence of a 90° pulse and a 180° pulse for producing a train of spin echoes (SE), a pulse sequence of a 90° pulse and repeated 180° pulses for producing a train of fast spin echoes (FSE), or a pulse sequence for producing a three-dimensional train of fast spin echoes, which are used for phase encoding, even in a slicing direction.

In the MRI apparatus according to the eleventh aspect, the MR image production method in accordance with the third aspect is preferably implemented.

According to the twelfth aspect of the present invention, the calibration scan means included in the MRI apparatus in accordance with any of the ninth to eleventh aspects uses the I coils and body coil to acquire calibration data.

In the MRI apparatus according to the twelfth aspect, the MR image production method in accordance with the fourth aspect is preferably implemented.

According to the thirteenth aspect of the present invention, the calibration scan means included in the MRI apparatus in accordance with any of the ninth to eleventh aspects uses the I coils alone to acquire calibration data.

In the MRI apparatus according to the thirteenth aspect, the MR image production method in accordance with the fifth aspect is preferably implemented.

According to the fourteenth aspect of the present invention, the real scan means included in the MRI apparatus in accordance with any of the ninth to thirteenth aspects applies a pulse sequence that brings about a phase difference of $2\pi/n$ ($n \geq 2$) between a water signal and a fat signal so as to acquire real data items detected by the respective coils. The synthesis means produces complex images $C(i)$ from the calibration data items detected by the respective coils, produces complex images $H(i)$ from the real data items detected by the respective coils, and produces a synthetic image V from the complex images $C(i)$ and complex images $H(i)$. The water image-fat image separation means produces at least one of a water image W and a fat image F from the synthetic image V.

In the MRI apparatus according to the fourteenth aspect, the MR image production method in accordance with the sixth aspect is preferably implemented.

According to the fifteenth aspect of the present invention, the real scan means included in the MRI apparatus in accordance with any of the ninth to thirteenth aspects applies a pulse sequence defined in the Dixon technique so as to acquire real data items detected by the respective coils. The synthesis means produces complex images $C(i)$ from the calibration data items detected by the respective coils, produces complex images $H1(i)$ and $H2(i)$ from the real data items detected by the respective coils, produces a synthetic image V1 from the complex images $C(i)$ and complex images $H1(i)$, and produces a synthetic image V2 from the complex images $C(i)$ and complex images $H2(i)$. The water image-fat image separation means produces at least one of a water image W and a fat image F from the synthetic images V1 and V2.

In the MRI apparatus according to the fifteenth aspect, the MR image production method in accordance with the seventh aspect is preferably implemented.

According to the sixteenth aspect of the present invention, the real scan means included in the MRI apparatus in accordance with any of the ninth to thirteenth aspects applies a pulse sequence defined in the three-point Dixon technique so as to acquire the real data items detected by the respective coils. The synthesis means produces complex images $C(i)$ from the calibration data items detected by the respective coils, produces complex images $H1(i)$, $H2(i)$, and $H3(i)$ from the real data items detected by the respective coils, produces a synthetic image V1 from the complex images $C(i)$ and complex images $H1(i)$, produces a synthetic image V2 from the complex images $C(i)$ and complex images $H2(i)$, and produces a synthetic image V3 from the complex images $C(i)$ and complex images $H3(i)$. The water image-fat image separation means produces at least one of a water image W and a fat image F from the synthetic images V1, V2, and V3.

In the MRI apparatus according to the sixteenth aspect, the MR image production method in accordance with the eighth aspect is preferably implemented.

An MR image production method and an MRI apparatus in accordance with the present invention can be utilized for production of a water image and a fat image.

According to an MR image production method and an MRI apparatus of the present invention, a plurality of coils is used to accurately produce separate water and fat images despite a small number of arithmetic operations and a short processing time.

Further objects and advantages of the present invention will be apparent from the following description of the preferred embodiments of the invention as illustrated in the accompanying drawings.

DETAILED DESCRIPTION OF THE INVENTION

The present invention will be described in more detail by taking an embodiment shown in drawings for instance. Noted is that the present invention will not be limited to the embodiment.

[First Embodiment]

Figure 1:
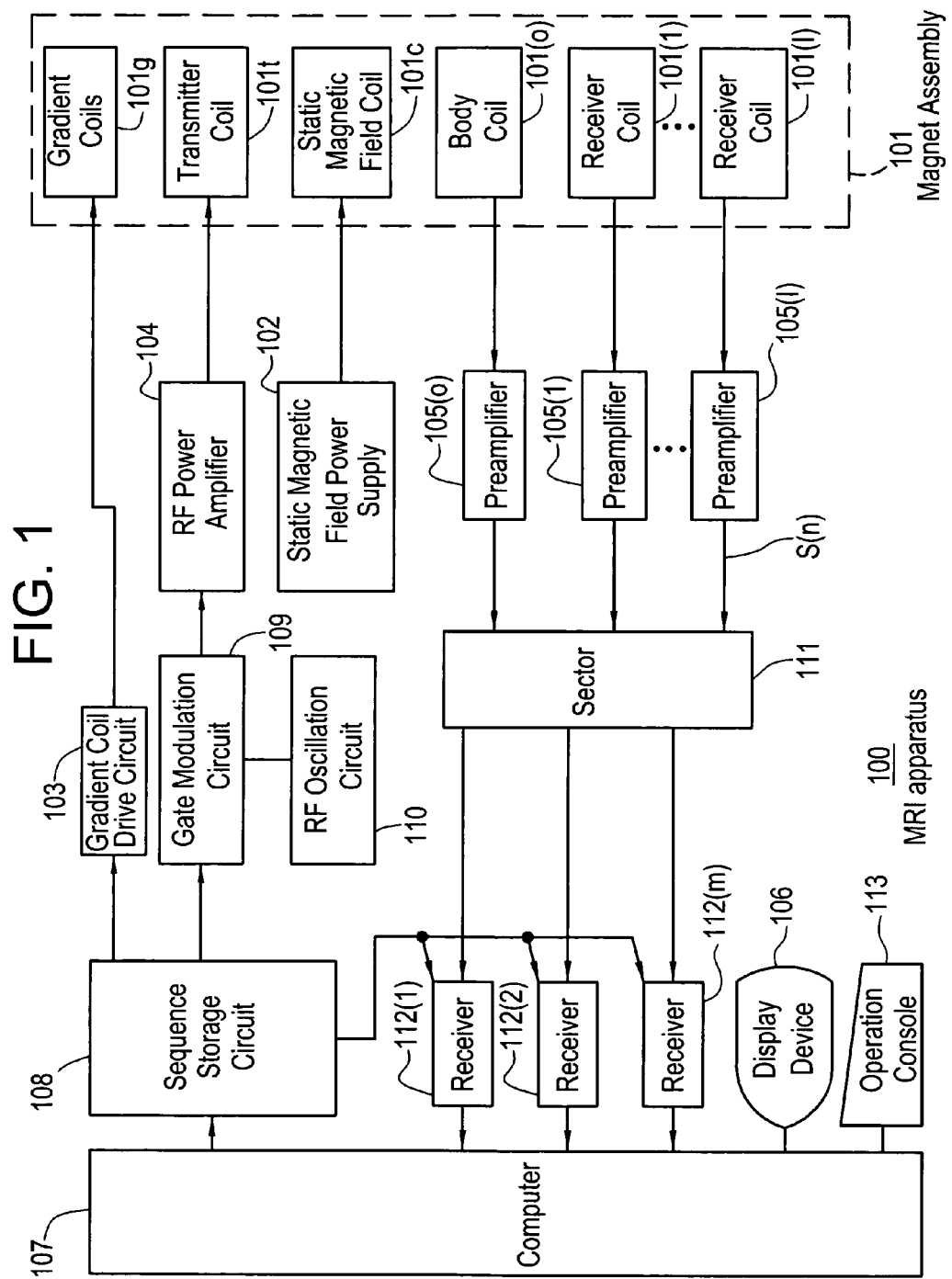
FIG. 1 is a block diagram showing the configuration of an MRI apparatus in accordance with the first embodiment of the present invention.

FIG. 1 is a block diagram showing an MRI apparatus 100 in accordance with the first embodiment.

In the MRI apparatus 100, a magnet assembly 101 has a bore, into which a subject is carried, formed inside. A static magnetic field coil 101C for applying a constant static magnetic field to a subject, gradient coils 101G for inducing magnetic field gradients in an X, Y, and Z axes respectively, a transmitter coil 101T for applying RF pulses with which spins of nuclei in a subject are excited, and a body coil 101(0) and I-channel receiver coils 101(1) to 101(I) for receiving NMR signals included by the subject are arranged about the bore.

The static magnetic field coil 101C, gradient coils 101G, and transmitter coil 101T are connected to a static magnetic field power supply 102, a gradient coil drive circuit 103, and an RF power amplifier 104 respectively. Moreover, the body coil 101(0) and the receiver coils 101(1) to 101(I) are connected to a preamplifier 105(0) and preamplifiers 105(1) to 105(I) respectively.

The body coil 101(0) may be used on behalf of the transmitter coil 101T.

Moreover, a permanent magnet may be substituted for the static magnetic field coil 101C.

A sequence storage circuit 108 operates the gradient coil drive circuit 103 according to a stored pulse sequence in response to a command sent from a computer 107 so that the gradient coils 101G will generate magnetic field gradients. Moreover, the sequence storage circuit 108 operates a gate modulation circuit 109 to modulate a carrier output signal of an RF oscillation circuit 110 into a pulsating signal having a predetermined timing, a predetermined envelope, and a predetermined phase. The pulsating signal is applied as RF pulses to the RF power amplifier 10. After the power of the pulsating signal is amplified by the RF power amplifier 104, the signal is applied to the transmitter coil 101T.

A selector 111 conveys NMR signals, which are received by the body coil 101(0) and the receiver coils 101(1) to 101(I) and amplified by the preamplifier 105(0) and the preamplifiers 105(1) to 105(I), to m receivers 112(1), 112(2), etc., and 112(m). The inclusion of the selector 111 makes it possible to vary the associations of the body coil 101(0) and the receiver coils 101(1) to 101(I) with the receivers 112(1), 112(2), etc., and 112(m).

The receivers 112(1), 112(2), etc., and 112(m) convert NMR signals from an analog form to a digital form, and transfer the resultant digital signals to the computer 107.

The computer 107 reads the digital signals sent from the receivers 112, and manipulates them to produce an MR image. Moreover, the computer 107 receives information entered at an operator console 113 and is thus responsible for overall control.

An image and a message are displayed on the display device 106.

Figure 2:
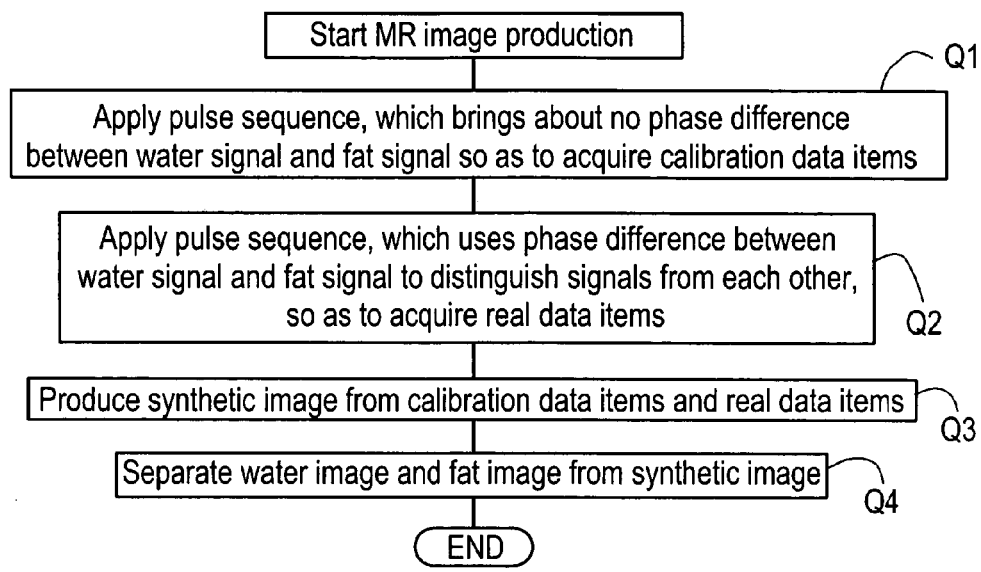
FIG. 2 is a flowchart describing MR image production in accordance with the first embodiment.

FIG. 2 is a flowchart describing MR image production in accordance with the first embodiment.

At step Q1, a pulse sequence that brings about no phase difference between a water signal and a fat signal is applied in order to receive NMR signals, which are induced by a subject, in parallel with one another using the body coil 101(0) and the receiver coils 101(1) to 101(I). Calibration data items c(0), c(1), etc., and c(I) detected by the respective coils are acquired.

Figure 3:
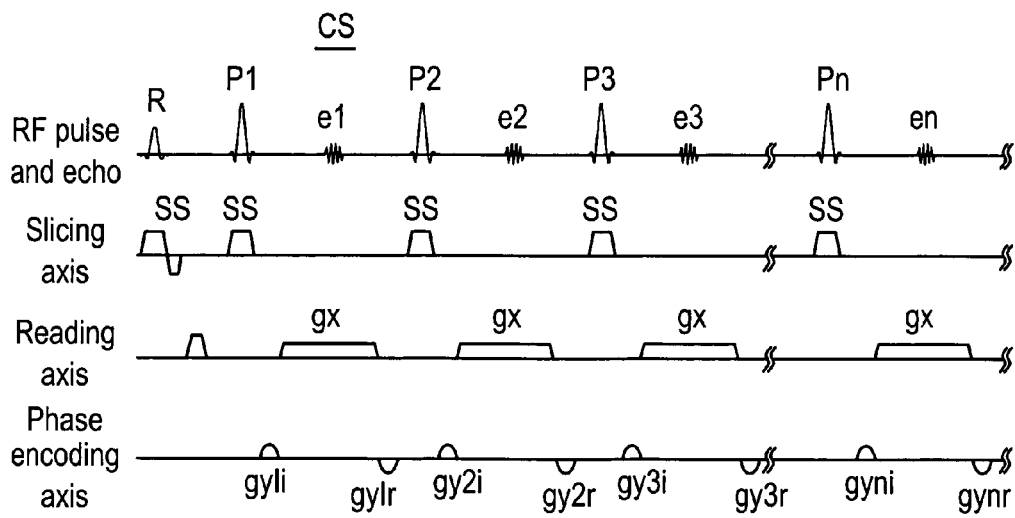
FIG. 3 is an explanatory diagram showing an example of a calibration data acquisition pulse sequence.

FIG. 3 shows the pulse sequence that brings about no phase difference between a water signal and a fat signal.

According to the calibration data acquisition pulse sequence CS, first, an excitation pulse R causing a flip angle of 90° and a slice selective magnetic field gradient ss are applied. Thereafter, a first inversion pulse P1 causing a flip angle of 180° and a slice selective magnetic field gradient ss are applied, and a phase encoding magnetic field gradient gy1i is applied. Thereafter, while a readout magnetic field gradient gx is applied, an echo e1 is received as an NMR signal. Thereafter, a rewind pulse gy1r is applied.

Next, a second inversion pulse P2 and the slice selective magnetic field gradient ss are applied, and a phase encoding magnetic field gradient gy2i is applied. While readout magnetic field gradient gx is applied, an echo e2 is received as an NMR signal. Thereafter, a rewind pulse gy2r is applied.

Thereinafter, the reception of the NMR signal is repeated in the same manner as described above.

Incidentally, the X, Y, and Z axes defined by the gradient coils 101G determine a slicing axis, a phase encoding axis, and a reading axis.

The calibration data acquisition pulse sequence CS shown in FIG. 3 is a pulse sequence for producing a train of fast spin echoes. Alternatively, a pulse sequence for producing a train of spin echoes or a pulse sequence for producing a three-dimensional train of fast spin echoes may be adopted in order to acquire calibration data items c(0), c(1), etc., and c(I).

Referring back to FIG. 2, at step Q2, a pulse sequence that uses a phase difference between a water signal and a fat signal to distinguish the signals from each other is applied in order to receive NMR signals, which are induced by a subject, in parallel with each other using the receiver coils 101(1) to 101(I) responsively. Real data items h(1) to h(I) detected by the coils are acquired.

Figure 4:
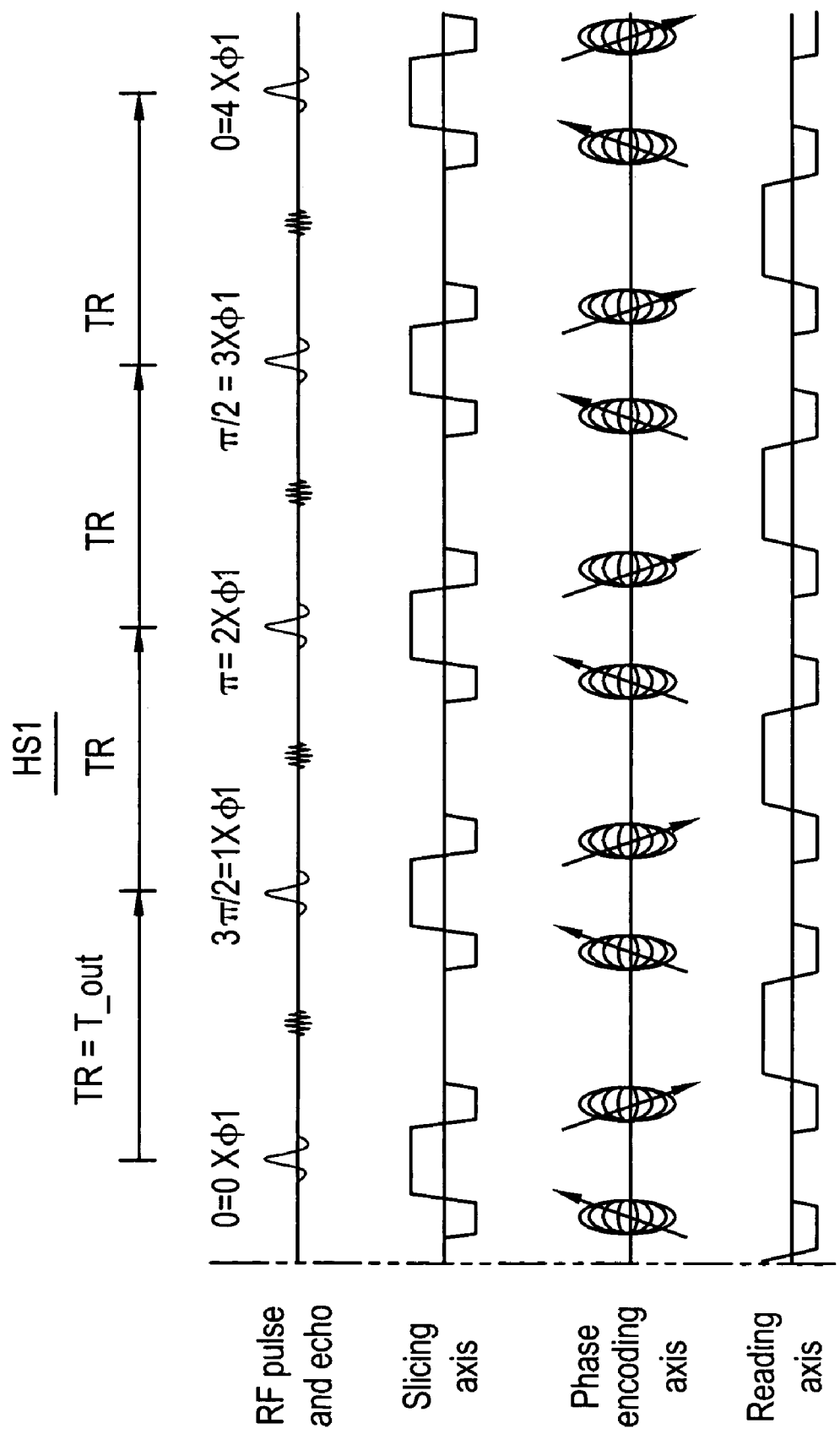
FIG. 4 is an explanatory diagram showing an example of a real data acquisition pulse sequence.
Figure 5:
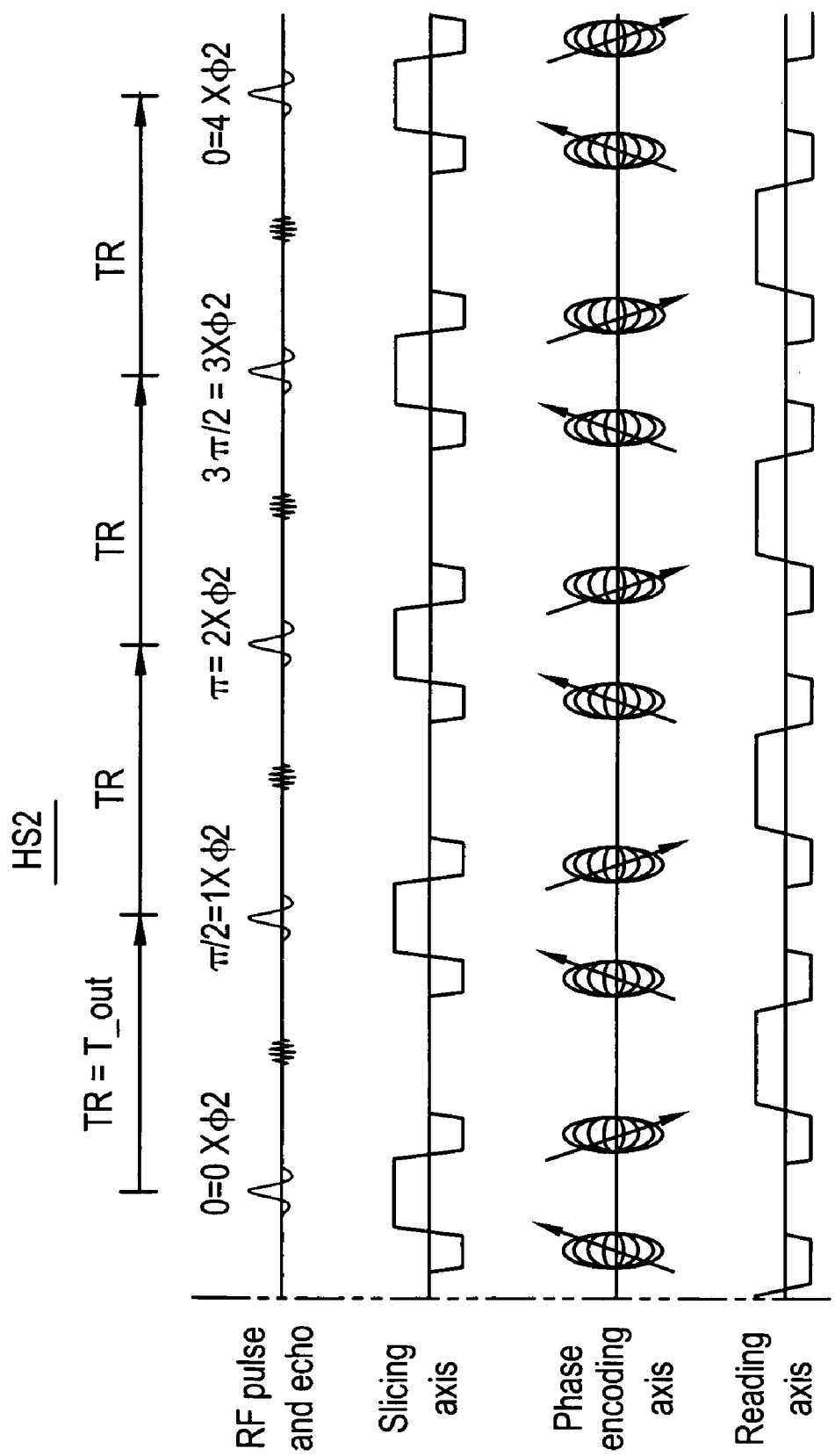
FIG. 5 is an explanatory diagram showing an example of a real data acquisition pulse sequence.

FIG. 4 and FIG. 5 show pulse sequences that use a phase difference between a water signal and a fat signal to distinguish the signals from each other.

For a real data acquisition pulse sequence HS1 shown in FIG. 4, an out-of-phase time T_out during which a water signal and a fat signal are out of phase with each other due to chemical shifts is adopted as a repetition time TR. A steady-state pulse sequence in which the phase of an RF pulse is varied in order of $0 \times \phi1$, $1 \times \phi1$, $2 \times \phi1$, $3 \times \phi1$, etc. where $\phi1$ equals $3\pi/2$ is applied in order to acquire real data items h1(1) to h1(I).

Moreover, for a real data acquisition pulse sequence HS2 shown in FIG. 5, an out-of-phase time T_out during which a water signal and a fat signal are out of phase with each other due to chemical shifts is adopted as the repetition time TR. A steady-state pulse sequence in which the phase of an RF pulse is varied in order of $0 \times \phi2$, $1 \times \phi2$, $2 \times \phi2$, $3 \times \phi2$, etc. where $\phi2$ equals $\pi/2$ is applied in order to acquire real data items h2(1) to h2(I).

The real data acquisition pulse sequences HS1 and HS2 shown in FIG. 4 and FIG. 5 are pulse sequences defined in the LCSSFP method.

Referring back to FIG. 2, at step Q3, based on the calibration data items c(0), c(1), etc., and c(I) and the real data items h(0), h(1), etc., and h(I), a synthetic image V is produced according to, for example, a procedure described below.

(1) Complex images C(0), C(1), etc., and C(I) are produced from the calibration data items c(0), c(1), etc., and c(I) respectively. Each of the complex images C(1) to C(I) produced from data items detected by the respective receiver coils is divided by the complex image C(0) produced from data detected by the body coil 101(0), whereby sensitivity maps s(1) to s(I) of the respective receiver coils are produced. A sensitivity matrix S is formed by orderly arranging the sensitivity maps s(1) to s(I).

(2) Complex images H1(1) to H1(I) are produced from the real data items h1(1) to h1(I) respectively, and a complex image matrix A1 is formed by orderly arranging the complex images H1(1) to H1(I).

(3) Complex images H2(1) to H2(I) are produced from the real data items h2(1) to h2(I) respectively, and a complex image matrix A2 is formed by orderly arranging the complex images H2(1) to H2(I).

(4) A synthetic image V1 is produced based on the sensitivity matrix S and complex image matrix A1 according to the following formula:

$$V1 = (S^H \psi^{-1} S)^{-1} S^H \psi^{-1} A1$$

(5) A synthetic image V2 is produced based on the sensitivity matrix S and complex image matrix A2 according to the following formula:

$$V2 = (S^H \psi^{-1} S)^{-1} S^H \psi^{-1} A2$$

At step Q4, a water image W and a fat image F are produced from the synthetic images V according to, for example, the procedure of performing calculations expressed below.

$$W = V1 + \exp(i \times \pi/2) \times V2 \quad (1)$$

$$F = V1 - \exp(i \times \pi/2) \times V2 \quad (2)$$

According to the MRI apparatus 100 of the first embodiment, water image-fat image separation (step Q4) requires a large number of arithmetic operations and a long processing time is not performed relative to each coil but performed on the synthetic images V. Consequently, the number of arithmetic operations is decreased and the processing time is shortened. Moreover, since a spin echo production pulse sequence is employed in a calibration scan, a water signal and a fat signal from which calibration data c is detected has no phase difference. Therefore, a phase difference between a water signal and a fat signal from which real data h is detected is held intact even after the synthesis step (step Q3) is completed (the phase difference is not disturbed by the calibration data c). Consequently, after the completion of the synthesis step (step Q3), the water image-fat image separation step (step Q4) can be accurately carried out.

[Second Embodiment]

The body coil 101(0) may not be used for reception but the receiver coils 101(1) to 101(I) alone may be used therefor. Calibration data items c(1) to c(I) may be detected by the receiver coils, and sensitivity maps s(1) to s(I) may be produced according to the sum-of-square method.

[Third Embodiment]

The method described in Patent Document 1 (Japanese Patent No. 3353826) may be applied to the present invention.

In this case, at the real scan step (step Q2), a pulse sequence that brings about a phase difference of $2\pi/n$ ($n \geq 2$) between a water signal and a fat signal is applied in order to acquire real data items that are detected by the respective coils. At the synthesis step (step Q3), complex images C(i) are produced from calibration data items detected by the respective coils, and complex images H(i) are produced from the real data items detected by the respective coils. A synthetic image V is produced from the complex images C(i) and complex images H(i). At the water image-fat image separation step (step Q4), at least one of a water image W and a fat image F is produced from the synthetic image V.

[Fourth Embodiment]

The Dixon technique may be applied to the present invention.

In this case, at the real scan step (step Q2), a pulse sequence defined in the Dixon method is applied in order to acquire real data items that are detected by the respective coils. At the synthesis step (step Q3), complex images C(i) are produced from calibration data items detected by the respective coils. Complex images H1(i) and H2(i) are produced from the real data items detected by the respective coils. A synthetic image V1 is produced from the complex images C(i) and complex images H1(i), and a synthetic image V2 is produced from the complex images C(i) and complex images H2(i). At the water image-fat image separation step (step Q4), at least one of a water image W and a fat image F is produced from the synthetic images V1 and V2.

[Fifth Embodiment]

The three-point Dixon technique may be applied to the present invention.

In this case, at the real scan step (step Q2), a pulse sequence defined in the three-point Dixon technique is applied in order to acquire real data items that are detected by the respective coils. At the synthesis step (step Q3), complex images C(i) are produced from calibration data items detected by the coils. Complex images H1(i), H2(i), and H3(i) are produced from the real data items detected by the respective coils. A synthetic image V1 is produced from the complex images C(i) and complex images H1(i), a synthetic image V2 is produced from the complex images C(i) and complex images H2(i), and a synthetic image V3 is produced from the complex images C(i) and complex images H3(i). At the water image-fat image separation step (step Q4), at least one of a water image W and a fat image F is produced from the synthetic images V1, V2, and V3.

[Sixth Embodiment]

A technique using fat saturation RF pulses or a fluctuation equilibrium MR technique may be applied to the present invention.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MR image production method comprising:
   a calibration scan step of applying a pulse sequence, which brings about no phase difference between a water signal and a fat signal, so as to acquire calibration data items that provide the distribution of sensitivities of coils;
   a real scan step of applying a pulse sequence, which uses the phase difference between a water signal and a fat signal to separate the signals from each other, so as to receive NMR signals, which are induced by a subject, in parallel with one another using I ($\geq 2$) coils, and acquiring real data items detected by the respective coils;
   a synthesis step of producing a synthetic image by performing arithmetic operations on the calibration data items and the real data items detected by the respective coils so as to remove aliasing oriented in a phase encoding direction; and
   a water image-fat image separation step of producing at least one of a water image and a fat image from the synthetic image.

2. The MR image production method according to claim 1, wherein at the calibration scan step, a spin echo production pulse sequence is employed.

3. The MR image production method according to claim 2, wherein the spin echo production pulse sequence is a pulse sequence of a 90° pulse and a 180° pulse for producing a train of spin echoes (SE), a pulse sequence of a 90° pulse and repeated 180° pulses for producing a train of fast spin echoes (FSE), or a pulse sequence for producing a three-dimensional train of fast spin echoes, which are used for phase encoding, even in a slicing direction.

4. The MR image production method according to claim 1, wherein at the calibration scan step, the I coils and a body coil are used to acquire calibration data.

5. The MR image production method according to claim 1, wherein at the calibration scan step, the I coils alone are used to acquire calibration data.

6. The MR image production method according to claim 1, wherein: at the real scan step, a pulse sequence bringing about a phase difference of $2\pi/n$ ($n \geq 2$) between a water signal and a fat signal is applied in order to acquire real data items detected by the respective coils; at the synthesis step, complex images C(i) are produced from the calibration data items detected by the respective coils, complex images H(i) are produced from the real data items detected by the respective coils, and a synthetic image V is produced from the complex images C(i) and complex images H(i); and at the water image-fat image separation step, at least one of a water image W and a fat image F is produced from the synthetic image V.

7. The MR image production method according to claim 1, wherein: at the real scan step, a pulse sequence defined in the Dixon technique is applied in order to acquire real data items detected by the respective coils; at the synthesis step, complex images C(i) are produced from the calibration data items detected by the respective coils, complex images H1(i) and H2(i) are produced from the real data items detected by the respective coils, a synthetic image V1 is produced from the complex images C(i) and complex images H1(i), and a synthetic image V2 is produced from the complex images C(i) and complex images H2(i); and at the water image-fat image separation step, at least one of a water image W and a fat image F is produced from the synthetic images V1 and V2.

8. The MR image production method according to claim 1, wherein: at the real scan step, a pulse sequence defined in the three-point Dixon technique is applied in order to acquire real data items detected by the respective coils; at the synthesis step, complex images C(i) are produced from the calibration data items detected by the respective coils, complex images H1(i), H2(i), and H(i) are produced from the real data items detected by the respective coils, a synthetic image V1 is produced from the complex images C(i) and complex images H1(i), a synthetic image V2 is produced from the complex images C(i) and complex images H2(i), and a synthetic image V3 is produced from the complex images C(i) and complex images H3(i); and at the water image-fat image separation step, at least one of a water image W and a fat image F is produced from the synthetic images V1, V2, and V3.

9. An MRI apparatus comprising:
a body coil;
I ($\geq 2$) coils;
a calibration scan device for applying a pulse sequence, which brings about no phase difference between a water signal and a fat signal, so as to acquire calibration data items that provide the distribution of the sensitivities of the coils;
a real scan device for applying a pulse sequence, which uses the phase difference between a water signal and a fat signal to separate the signals from each other, so as to receive NMR signals, which are induced by a subject, in parallel with one another using the I ($\geq 2$) coils, and acquiring real data items detected by the respective coils;
a synthesis device for producing a synthetic image by performing arithmetic operations on the calibration data items and the real data items detected by the respective coils so as to remove aliasing oriented in a phase encoding direction; and
a water image-fat image separation device for producing at least one of a water image and a fat image from the synthetic image.

10. The MRI apparatus according to claim 9, wherein the calibration scan device employs a spin echo production pulse sequence.

11. The MRI apparatus according to claim 10, wherein the spin echo production pulse sequence is a pulse sequence of a 90° pulse and a 180° pulse for producing a train of spin echoes (SE), a pulse sequence of a 90° pulse and repeated 180° pulses for producing a train of fast spin echoes (FSE), or a pulse sequence for producing a three-dimensional train of fast spin echoes, which are used for phase encoding, even in a slicing direction.

12. The MRI apparatus according to claim 9, wherein the calibration scan device uses the I coils and body coil to acquire calibration data.

13. The MRI apparatus according to claim 9, wherein the calibration scan device uses the I coils alone to acquire calibration data.

14. The MRI apparatus according to claim 9, wherein: the real scan device applies a pulse sequence, which brings about a phase difference of $2\pi/n$ ($n \geq 2$) between a water signal and a fat signal, so as to acquire real data items detected by the respective coils; the synthesis device produces complex images C(i) from the calibration data items detected by the respective coils, produces complex images H(i) from the real data items detected by the respective coils, and produces a synthetic image V from the complex images C(i) and complex images H(i); and the water image-fat image separation device produces at least one of a water image W and a fat image F from the synthetic image V.

15. The MRI apparatus according to claim 9, wherein: the real scan device applies a pulse sequence, which is defined in the Dixon technique, so as to acquire real data items detected by the respective coils; the synthesis device produces complex images C(i) from the calibration data items detected by the respective coils, produces complex images H1(i) and H2(i) from the real data items detected by the respective coils, produces a synthetic image V1 from the complex images C(i) and complex images H1(i), and produces a synthetic image V2 from the complex images C(i) and complex images H2(i); and the water image-fat image separation device produces at least one of a water image W and a fat image F from the synthetic images V1 and V2.

16. The MRI apparatus according to claim 9, wherein: the real scan device applies a pulse sequence, which is defined in the three-point Dixon technique, so as to acquire real data items detected by the respective coils; the synthesis device produces complex images C(i) from the calibration data items detected by the respective coils, produces complex images H1(i), H2(i), and H3(i) from the real data items detected by the respective coils, produces a synthetic image V1 from the complex images C(i) and complex images H1(i), produces a synthetic image V2 from the complex images C(i) and complex images H2(i), and produces a synthetic image V3 from the complex images C(i) and complex images H3(i); and the water image-fat image separation device produces at least one of a water image W and a fat image F from the synthetic images V1, V2, and V3.

* * * * *